United States Patent
Bailey et al.

(10) Patent No.: US 9,244,262 B2
(45) Date of Patent: Jan. 26, 2016

(54) LOW COST FOCUSSING SYSTEM GIVING HIGH CONCENTRATIONS

(75) Inventors: Paul B. Bailey, Oxford (GB); Michael W. Dadd, Oxford (GB); Charles R. Stone, Oxford (GB); Nicholas A. Jelley, Oxford (GB)

(73) Assignee: ISIS Innovation Limited, Oxford (GB)

( * ) Notice: Subject to any disclaimer, the term of this patent is extended or adjusted under 35 U.S.C. 154(b) by 647 days.

(21) Appl. No.: 13/703,575

(22) PCT Filed: Jun. 1, 2011

(86) PCT No.: PCT/GB2011/000836
§ 371 (c)(1),
(2), (4) Date: Feb. 21, 2013

(87) PCT Pub. No.: WO2011/154685
PCT Pub. Date: Dec. 15, 2011

(65) Prior Publication Data
US 2013/0206207 A1    Aug. 15, 2013

(30) Foreign Application Priority Data
Jun. 11, 2010 (GB) .................................. 1009852.3

(51) Int. Cl.
*G02B 5/10* (2006.01)
*G02B 19/00* (2006.01)
(Continued)

(52) U.S. Cl.
CPC .............. *G02B 19/0042* (2013.01); *F03G 6/06* (2013.01); *F24J 2/1047* (2013.01); *F24J 2/15* (2013.01);
(Continued)

(58) Field of Classification Search
CPC .. G02B 5/10; G02B 19/0042; G02B 19/0023; F03G 6/06; H01L 31/0525; Y02E 10/40; Y02E 10/41; Y02E 10/42; Y02E 10/45
USPC .................. 359/853, 857, 861; 136/246, 259; 60/641.15
See application file for complete search history.

(56) References Cited

U.S. PATENT DOCUMENTS 2,252,246 A   8/1941 Bergmans et al.
3,224,330 A  12/1965 Kompfner
(Continued)

FOREIGN PATENT DOCUMENTS

CN    201331615 Y   10/2009
DE     19602457 A1   7/1997
EP      1286208 A1   2/2003

OTHER PUBLICATIONS

Sanad M S A et al: "Parabolic cylindrical surfaces employed as line sources and their use for illuminating conical reflectors", Canadian Journal of Electrical and Computer Engineering, Engineering, USA, vol. 15, No. 1, Feb. 1, 1990.

*Primary Examiner* — Euncha Cherry
(74) *Attorney, Agent, or Firm* — Honigman Miller Schwartz and Cohn LLP

(57) ABSTRACT

There is disclosed a focussing system for concentrating radiation onto a target surface, comprising: a first reflective element forming part of the surface of a cone axially aligned along a first alignment axis, the first reflective element being positioned such that when planar radiation is incident on the first reflective element in a direction parallel to the first alignment axis, the planar radiation is focussed towards a first focus lying along the first alignment axis, wherein said part of the surface of a cone is contained within a sector having an included angle of less than 180 degrees; and a second reflective element having a reflective surface that at all points is flat in a direction parallel to a single reference direction, the second reflective element being positioned between the first reflective element and the first focus such that, when planar radiation is incident on the first reflective element in a direction parallel to the first alignment axis, radiation reflected from the first reflective element onto the second reflective element is focussed towards a second focus. A multiple target focussing system comprising a plurality of focussing systems, solar powered systems using focussing systems, kits, telescopes, defocussing light sources, and methods for assembling focussing systems are also disclosed.

20 Claims, 13 Drawing Sheets

(51) Int. Cl.
  *F24J 2/10* (2006.01)
  *F24J 2/15* (2006.01)
  *F24J 2/16* (2006.01)
  *F24J 2/38* (2014.01)
  *F03G 6/06* (2006.01)
  *H01L 31/052* (2014.01)
  *H01L 31/054* (2014.01)

(52) U.S. Cl.
  CPC .... *F24J 2/16* (2013.01); *F24J 2/38* (2013.01); *G02B 19/0023* (2013.01); *G02B 19/0033* (2013.01); *H01L 31/0525* (2013.01); *H01L 31/0547* (2013.01); *Y02E 10/46* (2013.01); *Y02E 10/47* (2013.01); *Y02E 10/52* (2013.01)

(56) References Cited

U.S. PATENT DOCUMENTS

| | | | |
|---|---|---|---|
| 8,283,554 B2* | 10/2012 | Bruning | H01L 31/0547 136/246 |
| 2004/0004175 A1 | 1/2004 | Nakamura | |
| 2005/0045174 A1 | 3/2005 | Ghausi | |

* cited by examiner

LOW COST FOCUSSING SYSTEM GIVING HIGH CONCENTRATIONS

BACKGROUND

Diminishing fuel reserves and the effects of climate change have highlighted the need to make the best use of all available energy sources. Solar energy is probably the most significant renewable energy source—it also has the advantage of minimal environmental impact. The development of technology for exploiting solar energy is very important for future energy production.

Solar energy can be utilized in a number of ways but for the production of 5-500 kW electrical power in dry sunny regions, where water is scarce, there are two leading possibilities: concentrated photo-voltaic (CPV) systems; and solar heated Stirling engines driving electrical generators.

What is needed for both are low cost solar concentrators that can produce high concentrations of at least 500 and preferably up to values in excess of 1000. For photo-voltaics, high efficiency Photo-Voltaic materials are expensive and high concentrations allow them to be used more cost effectively. For Stirling engines, high efficiency requires high heater temperatures and this can only be achieved with high levels of concentration.

Currently solar concentrators used to provide these high levels of concentration use designs that require reflective surfaces that are fully three dimensional. For example, in US2006266408 (Solfocus) a two stage concentrator is described that can provide high concentrations for Photo-Voltaic devices. The two mirrors are made out of glass and are silvered to give the required reflective coatings. The mirror profiles have curvature in two directions.

For Stirling engine applications, designs have centered on single stage parabolic reflectors that produce a point focus. Spherical reflectors have also been used—for high values of f/D (focal length/dish diameter) an approximate point focus is produced with a high enough concentration factor to be used in these applications. Alternatively, arrays of spherical reflectors have been used that approximate a parabolic reflector. Again the various reflector profiles have curvature in two directions.

Relatively expensive manufacturing techniques and materials are generally required to form the reflector profiles having curvature in two directions to the required accuracy. In addition, handling and transport of the reflective components from the factory to the installation site can be difficult, due to their bulk and potential fragility.

As well as the design of the basic concentrator system, other aspects of a complete solar generator system that need to be addressed concern the design of the cavity or window type receivers for Solar Stirling generators, aspects such as the angle of incidence for Photo-Voltaic generators, and more generally non-imaging "secondary" concentrators for both.

The principles used for the design of cavity receivers and non-imaging concentrators, such as Winston cones, are well established and known to those skilled in the art. See, for example, the following: 1) Pitz-Paal Robert. High Temperature Solar Concentrators. in Solar Energy Conversion and Photoenergy Systems in Encyclopedia of Life Support Systems. Eolss Publishers, Oxford UK 2007; and 2) Roland Winston, Juan C. Minano, Pablo Benitez, (with contributions by Narkis Shatz and John C. Bortz), Nonimaging Optics, Academic Press, 2004. (ISBN 0-12-759751-4). Also commercial software exists that greatly facilitates the design of these components. See, for example, ZEMAX, Optima Research Ltd, 8 Riverside Business Park, Stoney Common Road, Stansted, CM24 8PL, United Kingdom e.g. ZEMAX (ref 4). These tools are particularly useful for more detailed requirements such as attaining uniform temperature of the heater assembly or uniform illumination of the photo-voltaic cell.

SUMMARY

It is an object of the present invention to provide a system capable of providing the high concentration factors necessary for high efficiency photo-voltaic/Stirling generators while being reasonably compact and/or having the potential for low cost manufacture and convenient handling/transportation.

According to an aspect of the invention, there is provided a focussing system for concentrating radiation onto a target surface, comprising: a first reflective element forming part of a conical surface axially aligned along a first alignment axis, the first reflective element being positioned such that when planar radiation is incident on the first reflective element in a direction parallel to the first alignment axis, the planar radiation is focussed towards a first focus lying along the first alignment axis, wherein said part of the conical surface is contained within a sector having an included angle of less than 180 degrees; and a second reflective element having a reflective surface that at all points is flat in a direction parallel to a single reference direction, the second reflective element being positioned between the first reflective element and the first focus such that, when planar radiation is incident on the first reflective element in a direction parallel to the first alignment axis, radiation reflected from the first reflective element onto the second reflective element is focussed towards a second focus.

The part of a conical surface may alternatively be described as part of the surface of a cone and is a first order aspheric surface defined by $z=ar$, where $z$ is the displacement of the point on the surface from the vertex of the cone along the cone's axis, $r$ is the radial distance from the point on the surface to the cone's axis, and $a$ is a constant.

Preferably, the first focus is a line focus (i.e. a focus having an elongate form approximating a portion of a line). As such a line focus is most constrained in directions within a horizontal plane (when the first alignment axis is vertical), this focus may be referred to as a "horizontal focus".

Preferably, the second focus is a point focus (i.e. a focus that is spatially constrained in all directions, thereby approximating a point). As such a focus is spatially constrained in directions within a vertical plane relative to the first focus, this focus may be referred to as a "vertical focus".

The second reflective element may be formed from a parabolic mirror with an axis of curvature perpendicular to the first alignment axis—such a mirror has the shape of part of a parabolic trough.

This arrangement thus uses reflective elements that can be readily formed from flat sheet by simple bending—such surfaces are called developable. For a developable surface, three mutually orthogonal planes can be chosen in which the curvature of the surface is only non-zero in one of the planes: for the surface of a cone, the xy plane, where z is the axis of the cone; for the surface of a parabolic trough, the xy plane, where z is along the base of the trough.

Developable geometries of this kind can be referred to as "two-dimensional" and are characterized generally by surface geometries built up from locally flat linear elements (i.e. elements that have no curvature in a direction parallel to their length). In the case of the first reflective elements, which comprise a reflective surface corresponding to a part of a cone (a first order aspheric surface), the linear elements would run continuously from a lower extremity of the element to an upper extremity of the element, and be aligned towards the tip of the cone. In the case of the second reflective elements, where all parts of the surface are flat along the same reference direction, the linear elements are (infinitesimally thin) parallel strips. Such "two-dimensional" geometries provide several advantages relative to the alternative "three-dimensional" geometries (i.e. geometries having local curvature that cannot be achieved by simple bending) that are used in the prior art in the most similar contexts.

Firstly, the manufacturing processes and materials necessary to form the "three-dimensional" geometries tend to be more expensive. A "two-dimensional" design, in contrast, can be manufactured from reflective sheet by the simple process of bending. A "three-dimensional" design has to start with a material that can be machined or deformed, and a more complex manufacturing process is required to accurately achieve the required geometry. Glass is a material that is frequently used as the basis of a "three-dimensional" concentrator. The shape can be achieved by deforming a plate into a mold by a process called slump forming The reflective surface is achieved by the coating of the glass with a thin reflective coating—this process is familiar in the silvering of conventional glass mirrors; however, the material is not robust.

Secondly, a drawback of focussing systems based on reflectors having "three-dimensional" curvatures is associated with the handling and transport of concentrator components. With a "two-dimensional" design it is possible to pursue a "flatpack" concept where reflective elements and other components can be transported in a compact, easily handled flat form. The focussing system can be assembled at the chosen site and reflective elements formed into the appropriate geometry by relatively simple bending procedures. With "three-dimensional" designs it is unlikely that the geometry can be formed on site so it will be necessary to handle and transport finished "three-dimensional" optical components. This is clearly a more difficult and expensive task, particularly if the components are manufactured from an easily damaged material such as glass. Existing solar concentrators, that do have a "two-dimensional" design, tend to have insufficient concentration for high efficiency photo-voltaic or Stirling engine applications.

More generally, the provision of separate reflective elements provides greater flexibility in comparison to systems that rely on a single reflective element, because of the relative freedom to orient and/or position the reflective elements to achieve different focus positions.

For example, the first and second reflectors may be configured so that the second focus is above the second reflector, such that radiation approaches the focus from below. This arrangement may be useful where the target for the focussed radiation is within a housing provided for restricting upward movement of gas in the region of the target (to reduce convective losses). For example, this approach enables radiation windows to open out downwards and/or be positioned in a lower part of the housing, which naturally restricts escape of hot gases relative to arrangements where this is not the case. As a further example, the reflective elements may be arranged so that the second focus is in close proximity to one or both of the first or second reflective elements, which makes it easier to provide a light, low cost support structure.

Depending on the context, the second focus can be arranged relative to the first alignment axis so as to be radially outside of one or both of the first and second reflective elements, or radially inward of one or both of the first and second reflective elements. At the same time, the second focus can be arranged to be longitudinally nearer to the source of the incident radiation than one or both of the first and second reflective elements, or can be longitudinally further from the source than one or both of the first and second reflective elements.

As discussed above, the reflective elements can be formed by simple bending or rolling of flat strips of material. Preferably, the flat strips are rectangular to facilitate manufacture. The strips may also be formed from aluminium, which can be shaped efficiently, and is light and strong.

The first or second reflective element may be formed from a plurality of reflective elements. In both cases, the reflective elements within each group can be spaced apart to allow air to flow between the individual elements, thereby reducing wind forces and enabling a lighter, lower cost construction, while not altering the collecting area. If the individual elements are simply displaced vertically (parallel to the first alignment axis), relative to where they would have been had they been joined integrally, then the 'footprint' or collecting area of each reflective element (i.e. of each element formed from a plurality of strips) is not altered.

The use of multiple second reflective elements makes it possible to achieve greater than unity concentration of rays reflected from the second reflective elements even when the secondary reflective elements are formed from plane mirrors. It is thus possible to realize high concentrations whilst benefiting from the cost savings associated with the relative ease of manufacture, transport and on-site installation of planar mirrors in comparison with mirrors that have to be bent into the required shape.

The shapes of the reflective surfaces of the reflective elements can be adapted so as to produce a uniform power distribution at the second focus. This can be achieved by controlling the overall shape of the reflective elements or by applying a suitably shaped non-reflective mask to the reflective elements.

The reflective elements may be formed into the required shape by either using curved guides or by clamping nominally flat strips/facets of material in such a way as to impose the boundary conditions that force them to bend as desired. The reflective elements may thus be formed at the location where the solar focussing system is to be deployed, thus avoiding careful (and therefore expensive) transportation of pre-shaped components. The reflective elements may also be tuned on site, by adjusting the clamping conditions, for an optimal focus, or tuned to correct for damage of the flat starting materials during transportation or for general wear and tear and/or fatigue.

According to a further aspect of the invention, a multiple target focussing system may be provided, which consists of two or more focussing systems, each configured to produce different second foci. The different second foci may be spatially separated from each other, for example along a direction parallel to the first alignment axis of one or more of the focussing systems in the multiple target focussing system and/or along a direction perpendicular to the first alignment axis of one or more of the focussing systems in the multiple target focussing system. In this way, it is possible simultaneously to concentrate radiation onto more than one target in a flexible manner.

According to a further aspect of the invention, there is provided a solar powered system, comprising: a heat driven engine; a heat exchanger surface for receiving solar energy to drive the heat driven engine; and a focussing system according to an embodiment of the invention that is configured to concentrate solar radiation onto the heat exchanger surface.

The heat exchanger surface may be in the form of heater tubes within a cavity defined by a housing, for example.

Preferably, the reflective elements are arranged so that light will be incident on the heat exchanger from below, which makes it easier to control convective heat losses. Where this is the case, the solar focussing system is preferably configured to direct radiation in an upwards direction towards the secondary focus. A concentrator and/or homogenizer may be provided to further control the degree of focus and/or distribution of radiation incident on the heat exchanger.

The solar powered system may further comprise a second heat exchanger surface, spaced apart from the first heat exchanger surface, for receiving solar energy to drive a different part of the heat driven engine to the first heat exchanger surface. In this case, a multiple target focussing system according to an embodiment of the invention may be provided for independently focussing solar radiation onto each of the heat exchanger surfaces.

This approach may be useful where the heat driven engine is a linear multi-cylinder Stirling engine comprising a plurality of longitudinally spaced apart heat exchangers (e.g. one for each cylinder), for example. Using sets of separate reflective elements rather than a single reflector provides the necessary flexibility for efficiently dealing with this situation, even where the axis of the linear engine is parallel to the incident solar light.

Such an arrangement can also be useful where it is desired to focus light onto different heat exchangers that are separated from each other in a direction perpendicular to the first alignment axes of the reflective elements (and to the incident solar light). For example, this approach might be useful where a linear multi-cylinder Stirling engine is to be oriented horizontally. This approach might also be useful where different sets of reflective elements are to be used to focus light onto different elements of a single heat exchanger (e.g. heater tubes) where these elements are displaced significantly from the axis of the heat exchanger.

According to a further aspect of the invention, there is provided a solar powered system comprising: a photo-voltaic generator; and a focussing system according to an embodiment of the invention which is configured to concentrate solar radiation onto the photo-voltaic generator. The system may have a housing to contain the photo-voltaic generator, with means for dissipating rejected heat and for protecting the photo-voltaic generator from damage. In preferred embodiments the receiving face of the photo-voltaic generator is directed downwards so that unwanted debris is discouraged from accumulating on the receiving surface. As described above, the focussing system can be adapted to focus light upwards onto such a surface by suitable positioning and orientation of the reflectors. A secondary element may be provided to help ensure that the solar flux is optimally focussed onto the surface of the photocell. This element could be a concentrator or a homogenizer.

BRIEF DESCRIPTION OF THE DRAWINGS

Embodiments of the invention will now be described, by way of example only, with reference to the accompanying drawings in which corresponding reference symbols indicate corresponding parts, and in which:

FIG. 5b is a schematic perspective view of the focussing system according to FIG. 5a;

EMBODIMENTS OF THE INVENTION

Figure 1:
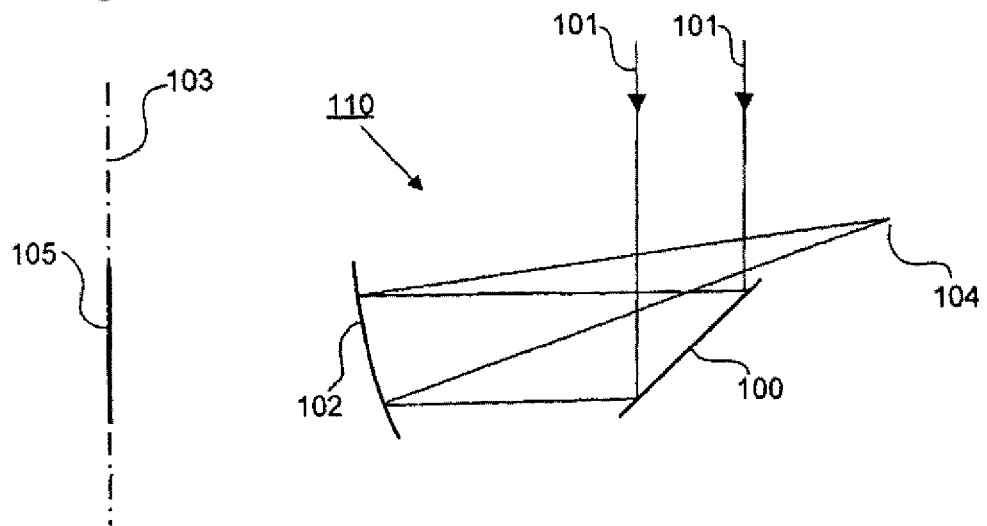
FIG. 1 is a schematic side view of a focussing system comprising a first reflective element formed from a sector of the surface of a cone and a second reflective element formed from a mirror having curvature along a single direction, and shows the position of a line focus running along the first alignment axis.

FIG. 1 is a schematic illustration of a focussing system 110 according to an embodiment of the invention. The focussing system 110 comprises a first reflective element 100 and a second reflective element 102. The first reflective element 100 takes the form of a portion of the surface of a cone (a conical surface) having a first alignment axis 103. The first reflective element 100 reflects light towards a line focus 105 along the first alignment axis when planar light 101 is incident on the focussing system 110 in a direction parallel to the first alignment axis 103.

The line focus 105 can best be depicted by viewing in a horizontal plane (perpendicular to the axis 103 of the cone), and can therefore be referred to as a "horizontal focus".

The second reflective element 102 comprises a curved reflecting surface that is positioned between the first reflective element 100 and its line focus 105. The second reflective element 102 has curvature in only one direction and the axis of curvature at a point is perpendicular to the cone axis.

The second reflective element 102 reflects the light from the first reflective element and produces a new focus 104 that will generally have a higher concentration than the horizontal focus 105. This new focus 104 is referred to below as the "second focus", but as the focussing action can best be seen in the vertical plane (i.e. viewed in a vertical plane, the spatial extent of the second focus is smaller than the spatial extent of the horizontal focus), the second focus may be considered to be a vertical focus. The second focus 104 is in a plane that contains the first alignment axis 103 and is normal to the second reflective element 102.

If the second focus 104 is placed behind or in the vicinity of the first reflective element 100 then provision may need to be made for the passage of the focused light through the first reflective element 100 and for the installation of suitable receiver components. This can be done by having a suitable opening in the first reflective element 100 or by splitting the first reflective element 100 in two with a gap for the reflected focus.

FIGS. 2 to 6 show preferred embodiments that produce point foci 104. In each case, the first reflective element 100 comprises a sector of the surface of a cone in combination with a second reflective element 102 consisting of a "two-dimensional" parabolic reflector (i.e. a reflector which has curvature along a single direction in the form of a parabola).

For preferred cases where the surface of the cone is inclined at 45 degrees, it is possible to achieve an aberration free focus, as described in detail below with reference to FIGS. 15a to 15c. If the surface of the cone is inclined at an angle other than 45 degrees to the first alignment axis, the point focus is approximate.

Figure 2:
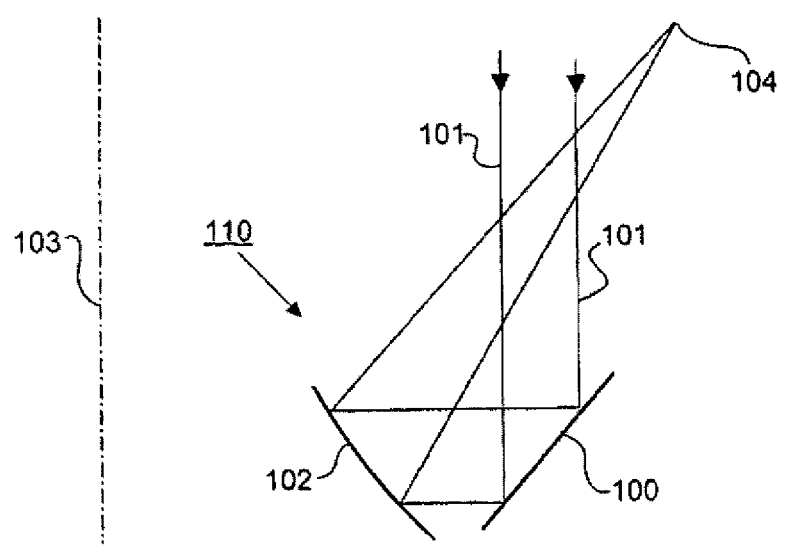
FIG. 2 is a schematic side view of a focussing system of the general type shown in FIG. 1, wherein the first and second reflective elements are configured so as to form a point focus that is well above both of the reflective elements, so rays converge almost vertically towards the point focus, and further from the first alignment axis that the first and second reflective elements.

In FIG. 2, the focussing system 110 is arranged so that light is directed upwards towards a second focus 104 positioned above and just behind (radially outward from) the first reflective element 100. The arrangement has two features that make it particularly attractive for Solar Stirling applications. Firstly the upward direction of the light into the second focus 104 makes it suitable for entry into a cavity type receiver where convection losses need to be minimized (the opening for the light will be in a lower portion of the cavity, whereas hot gases will tend to rise within the cavity). Secondly, having the second focus 104 close to the first reflective element 100 allows the Engine/Receiver to be positioned close to the first reflective element 100. Positioning the major component masses in close proximity to each other increases the scope for designing a light, low cost support structure.

Figure 3:
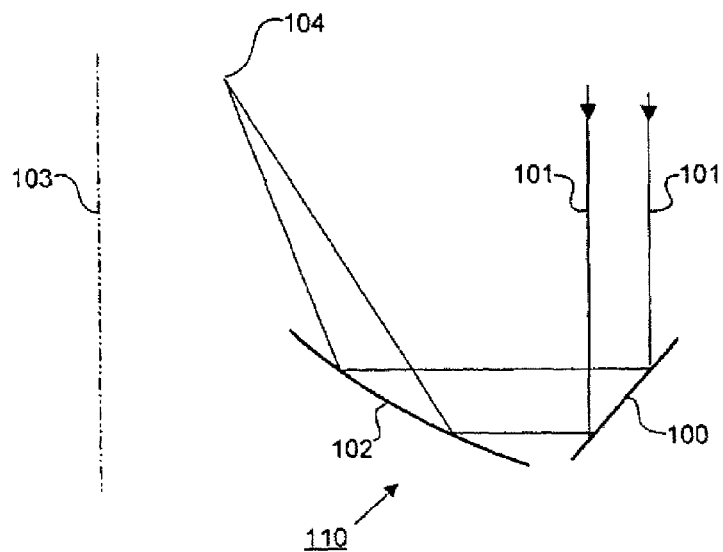
FIG. 3 is a schematic side view of a focussing system similar to that shown in FIG. 2, except that the point focus is formed nearer to the first alignment axis than the first and second reflective elements.

In FIG. 3 the second reflective element 102 is adjusted to put the second focus 104 above and just beyond the second reflective element 102 (i.e. the second focus 104 is nearer to the first alignment axis 103 than the second reflective element 102 and above the second reflective element 102). Again the upward direction of light rays to a second focus 104 makes this arrangement particularly suitable for Solar Stirling applications.

Figure 4:
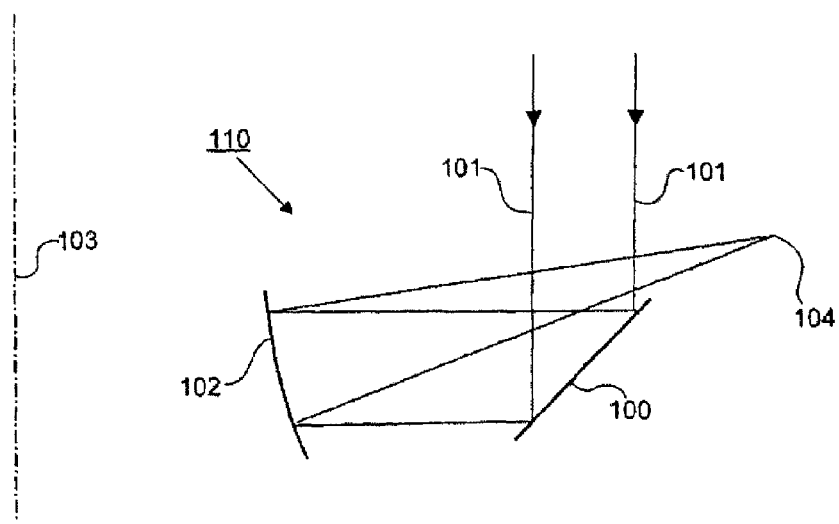
FIG. 4 is a schematic side view of a focussing system of the general type shown in FIG. 1, wherein the first and second reflective elements are configured to form a point focus that is only just higher than the first reflective element and further from the first alignment axis than the first reflective element.

In FIG. 4 the second reflective element 102 is adjusted to put the second focus 104 further behind the first reflective element 100 (i.e. further from the first alignment axis 103) and at a lower height, relative to the arrangement of FIG. 2. The light rays converging on the second focus 104 in this arrangement will be much closer to the horizontal than in the arrangement of FIG. 2, so are less suited to Solar Stirling applications from the point of view of minimizing convection losses. However, it is more compact and would be very suited to photo-voltaic applications where convection losses are not an issue.

Figure 5A:
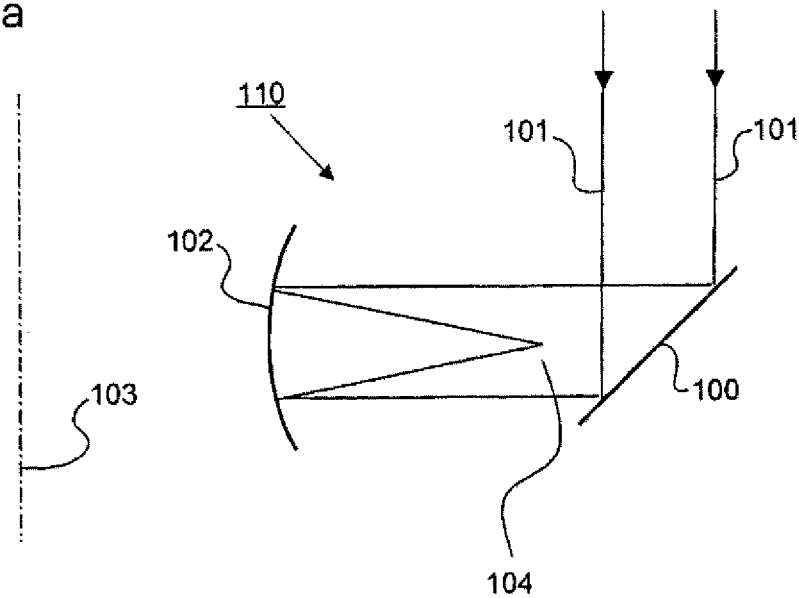
FIG. 5a is a schematic side view of a focussing system in which the point focus is formed at a position in between the first and second reflective elements.
Figure 5B:
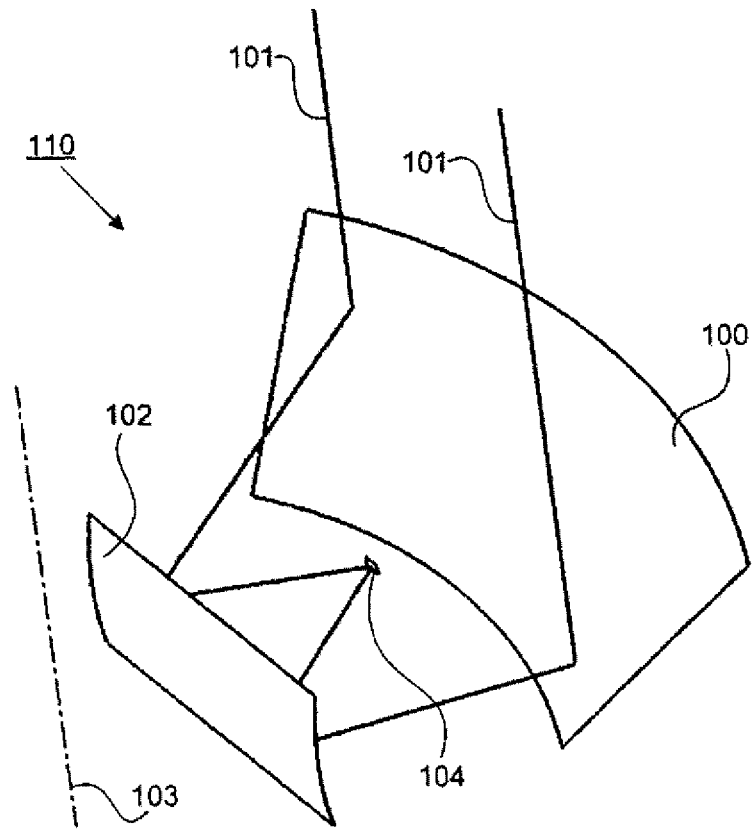

FIGS. 5a (side view) and 5b (perspective view) show a compact arrangement in which the second focus 104 is positioned between the first reflective element 100 and the second reflective element 102. For the same reasons as the arrangement shown in FIG. 4, this variation is primarily suited to photo-voltaic applications. Note that the target at the second focus 104 will cause a small shadow on the second reflective element 102.

Figure 6:
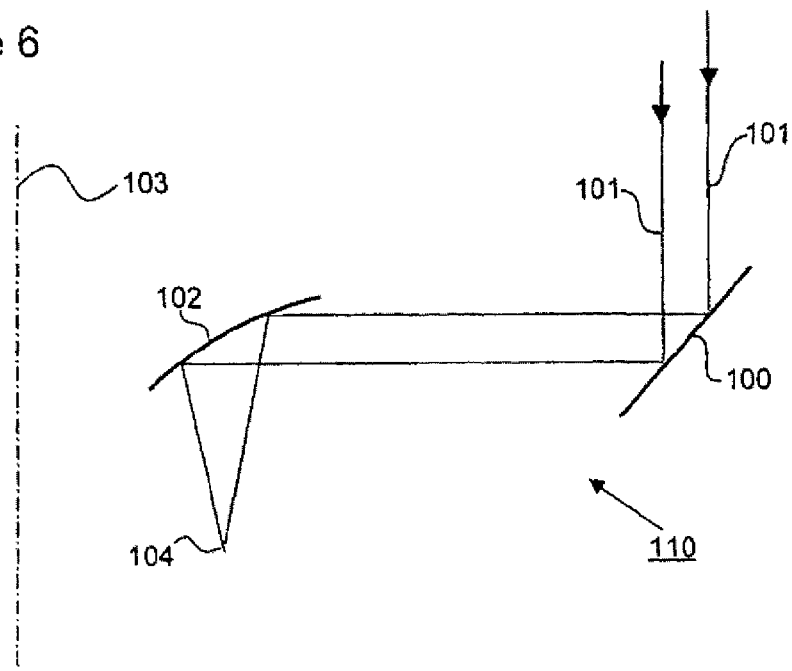
FIG. 6 is a schematic side view of a focussing system in which the first and second reflective elements are configured to produce a point focus that is directly below the second reflective element.

FIG. 6 shows an embodiment in which the second focus 104 is arranged to be below the second reflective element 102 (i.e. further from the source of the incident planar radiation 101 than the second reflective element 102), illustrating the flexibility of the overall approach and the ease with which the focussing system 110 can be adapted to fit with different operating environments and requirements.

The embodiments described above give considerable flexibility for positioning the second focus 104 relative to the first and second reflective elements 100 and 102, but the angle of incidence of the incident radiation 101 is generally fixed for a particular position of the second focus 104.

Figure 7:
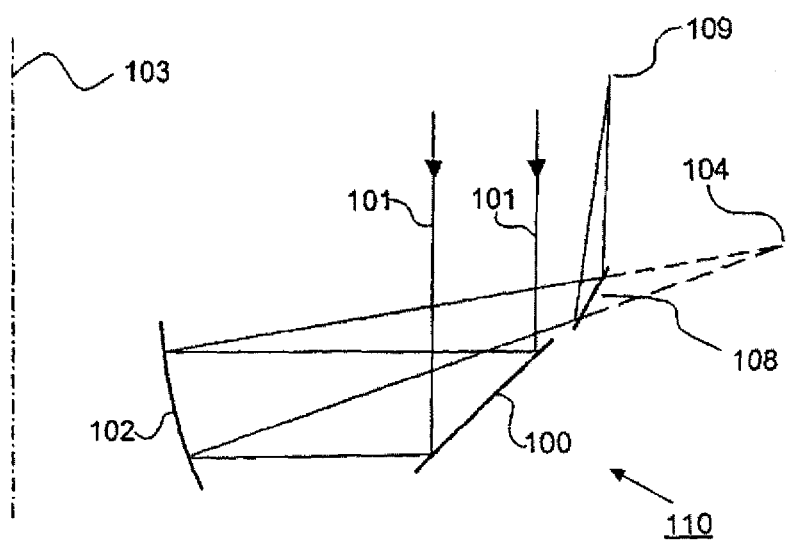
FIG. 7 is a schematic side view of a focussing system comprising a third reflective element configured to re-direct the point focus directly upwards.

FIG. 7 shows an alternative embodiment in which a third reflective element 108 is provided, in this case in the form of a plane mirror. The third reflective element 108 is configured so as to cause rays converging towards the second focus 104 to be re-directed towards a new focus 109. In this embodiment, the third reflective surface 108 is positioned directly below the new focus 109 so that incident light converges towards the new focus 109 in a vertical or near vertical direction. It would be possible to position the second focus 104 at the same point without the additional third reflective element 108, but the angle of incidence in this case would be fixed to a value closer to the horizontal. The addition of the third reflective surface 108 therefore provides even greater flexibility by allowing more independent selection of the position of the final point focus 109 and the direction of incidence of the light rays converging towards that focus 109.

Figure 8:
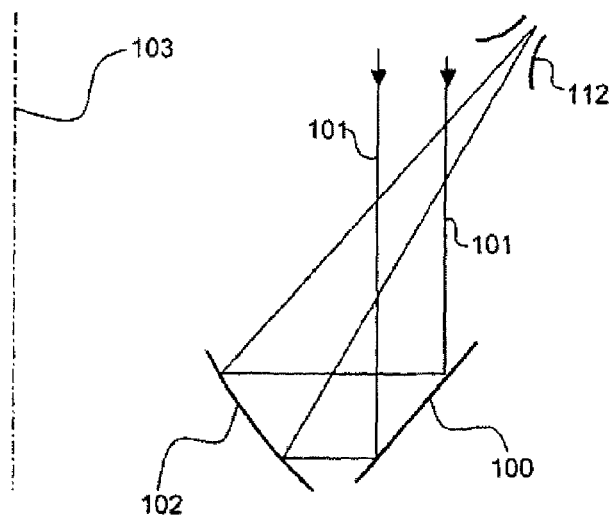
FIG. 8 is a schematic side view of a focussing system comprising a secondary concentrator to further concentrate light focussed from the second reflective element.

Although the concentrations produced in the arrangements shown in FIGS. 2 to 7 will be high enough for typical Solar Stirling and Photo-Voltaic applications it is also possible to further increase the concentration by the use of a secondary concentrator. FIG. 8 shows such an arrangement where a trumpet type concentrator 112 is added to the embodiment shown in FIG. 2. It gives a maximum concentration in excess of 10,000.

Figure 9:
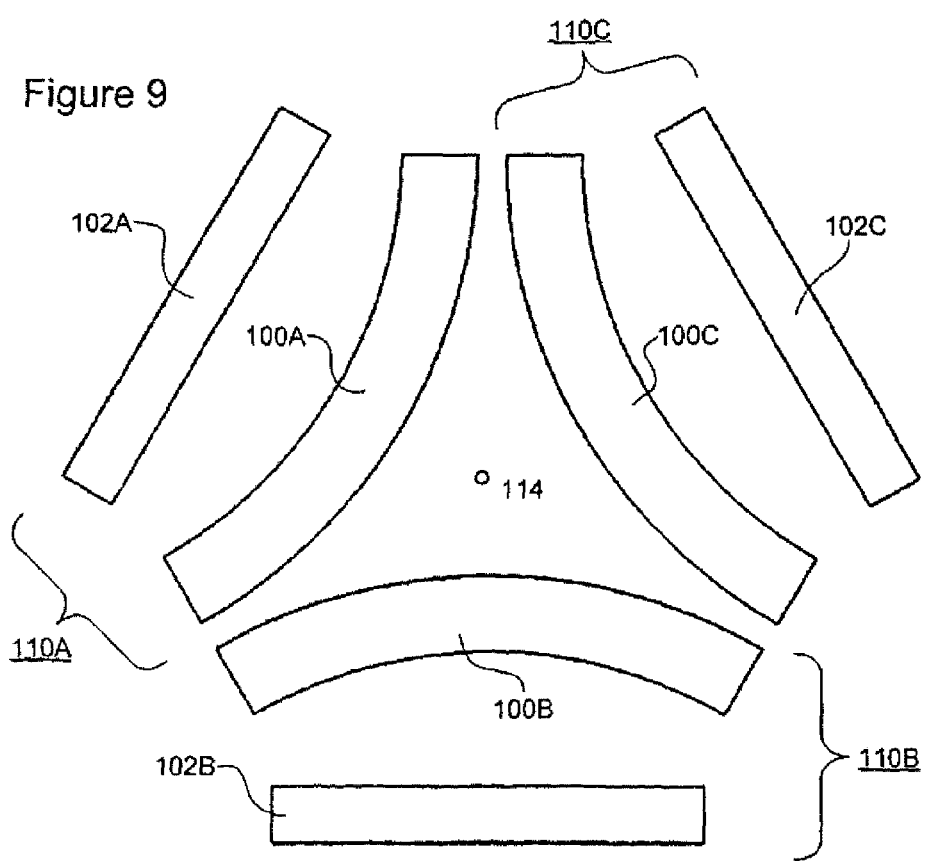
FIG. 9 is a schematic top view of a focussing system comprises a plurality of pairs of first and second reflective elements.

The incident solar flux can also be increased by combining two or more individual focussing systems. FIG. 9 is a schematic top view of such an arrangement, looking down an alignment axis (the "second alignment axis 114") that is parallel to the three first alignment axes (not shown) of the three focussing systems 110A-C of the example. The three focussing systems 110A-C of the example are positioned in a polar array (defined relative to the second alignment axis) with a single common focus. Each focussing system 110A-C comprises a suitably positioned and oriented first reflective element 100A-C and a suitably positioned and oriented second reflective element 102A-C.

The above embodiments describe concentrators where the incident radiation is concentrated to a single point focus. It also possible to split the second reflective element 102 into two or more smaller "two-dimensional" parabolic mirrors, that each generate a separate point focus.

Although the highest concentrations are obtained with embodiments that use "two-dimensional" parabolic mirrors as the second reflective element 102 (as described above), it is also possible to obtain high concentrations with embodiments that use only plane mirrors as the second reflective element 102. These have the advantage of a simpler construction.

A single mirror whose surface is part of a cone (as first reflective element) combined with a single plane mirror (as second reflective element) will give a vertical concentration (i.e. the concentration of the rays leaving the second reflective element) of unity, so the overall concentration is relatively low. The concentration can be increased, however, by combining two or more such assemblies on a common concentrator axis. The foci are arranged to overlap (i.e. the vertical foci are arranged to be coincident with each other and the horizontal foci are arranged to be coincident with each other) so that if there are two assemblies then the overall concentration is increased by a factor of two.

The construction of this embodiment can be simplified by arranging the reflectors that use cone/conical (1st order aspheric) surfaces to have a common inclination so that they can be merged into a single reflector. Alternatively the "two-dimensional" mirrors can have the same elevation allowing them to be merged into a single component; the surfaces of the cones are then required to have different angles of inclination.

Although the use of multiple elements can increase the overall concentration it may still be insufficient for some applications. For such cases the concentration can be further increased by the use of a non-imaging secondary concentrator. The use of such secondary concentrators for this purpose is well established in the field of solar concentrators.

In two further preferred embodiments a secondary concentrator arrangement is used to enhance primarily the combined vertical focus in systems comprising either a first reflective element that is made up from a plurality of separate reflective elements or a second reflective element that is made up from a plurality of separate reflective elements. The combined vertical focus originates from the intersection of radiation reflected from all of the plurality of reflective elements making up the second reflective element or from all of the plurality of reflective elements making up the first reflective element after reflection from the second reflective element; the focus itself corresponds to the region in the vertical plane (parallel to the first alignment axis and normal to the first reflective element) at which the intersecting radiation is most concentrated or "focussed". A combined horizontal focus is also formed by the line foci originated from radiation reflected from all of the plurality of reflective elements making up the second reflective element or from all of the plurality of reflective elements making up the first reflective element after reflection from the second reflective element.

The preferential concentration of the vertical focus is achieved by arranging for the combined vertical focus to be located at the entrance to the secondary concentrator whilst positioning the combined horizontal focus at the exit of the concentrator. It will be seen that the secondary concentrator has a particularly simple construction but is still capable of producing large overall concentrations at the secondary concentrator exit.

Figure 10:
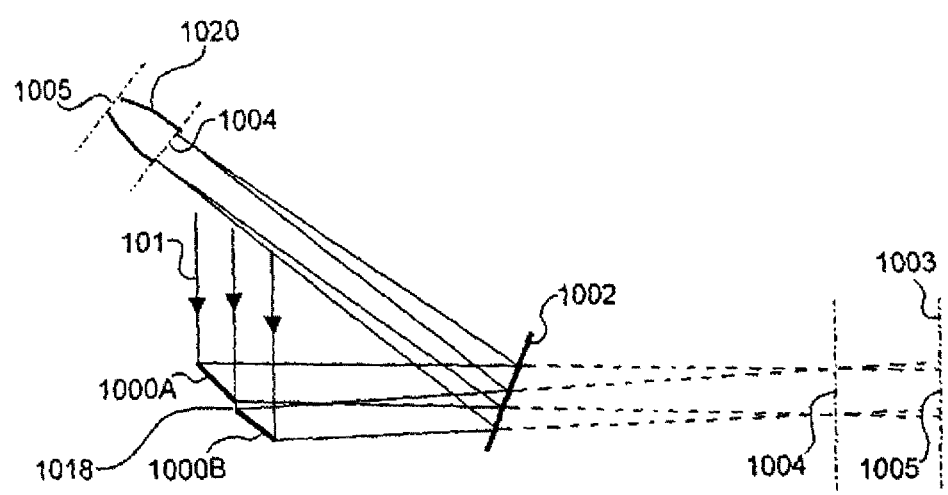
FIG. 10 is a schematic side view of an arrangement comprising two first reflective elements, separated from each other by an air gap and configured so that horizontal foci and vertical foci originating from different reflective elements converge respectively onto the exit and entrance of a secondary concentrator.

FIG. 10 shows an embodiment where a first reflective element formed from two separate reflective elements 1000A and 1000B, each formed as sectors of the surfaces of cones and separated by an air gap 1018, and a second reflective element 1002 formed from a single plane mirror, are combined with a secondary concentrator 1020 that is configured to act primarily on the combined vertical focus 1004. The reflected combined vertical focus 1004 is arranged to be positioned at the entrance to the secondary concentrator 1020 and the reflected combined horizontal focus 1005 is arranged to be positioned at the exit of the secondary concentrator 1020.

Figure 11A:
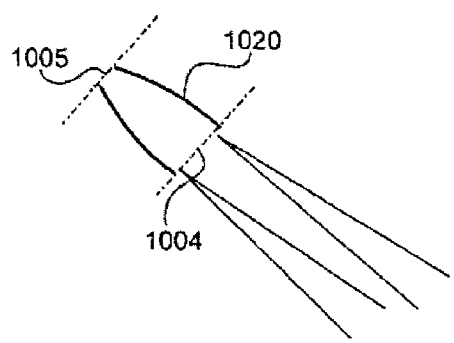
FIG. 11a is a magnified view of the secondary concentrator and incident rays shown in FIG. 10.
Figure 11B:
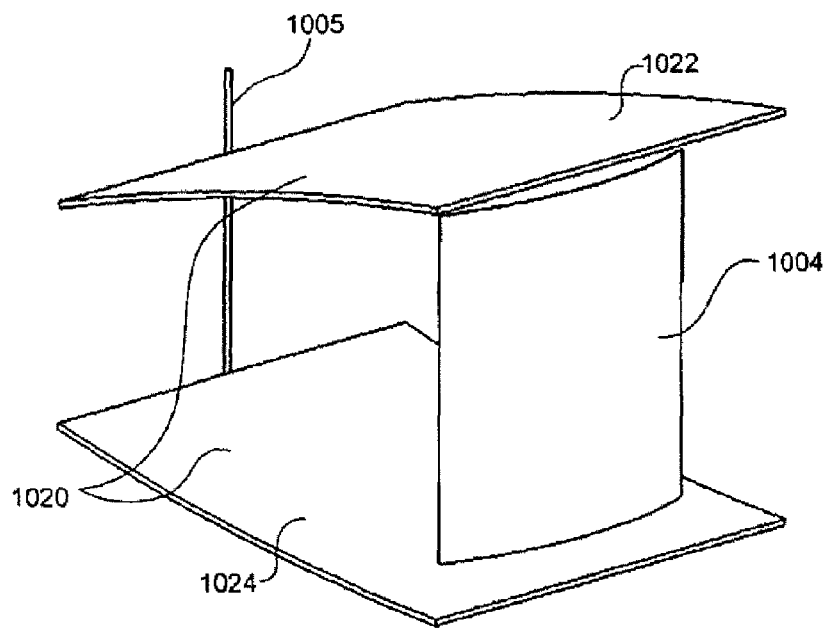
FIG. 11b is a schematic perspective view of the secondary concentrator of FIG. 11a showing the horizontal and vertical foci.

FIGS. 11a and 11b show details of the secondary concentrator 1020 of FIG. 10, showing upper and lower curved reflective surfaces 1022 and 1024, respectively. These diagrams show more clearly how the combined vertical focus 1004 is positioned at the entrance to the secondary concentrator 1020 whilst the combined horizontal focus 1005 is located at the concentrator exit.

Figure 12:
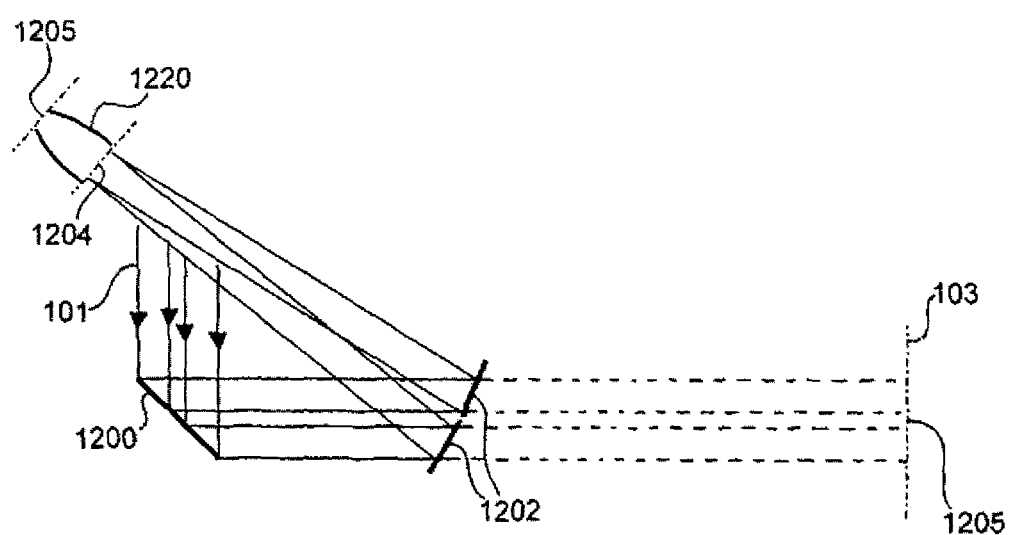
FIG. 12 is a schematic side view of a variation similar to that depicted in FIGS. 10, 11a and 11b except that two separated second reflective elements are provided instead of two separated first reflective elements.

FIG. 12 shows a similar arrangement to that in FIG. 10 except that there is a single first reflective element 1200 formed from a sector of the surface of a cone with a second reflective element formed from two separate plane mirrors 1202. Again it will be seen that the combined vertical 1204 and horizontal 1205 foci, originating from the different plane mirrors 1202, are located in different positions, at the entrance and exit of the secondary concentrator 1220, respectively.

Figure 13A:
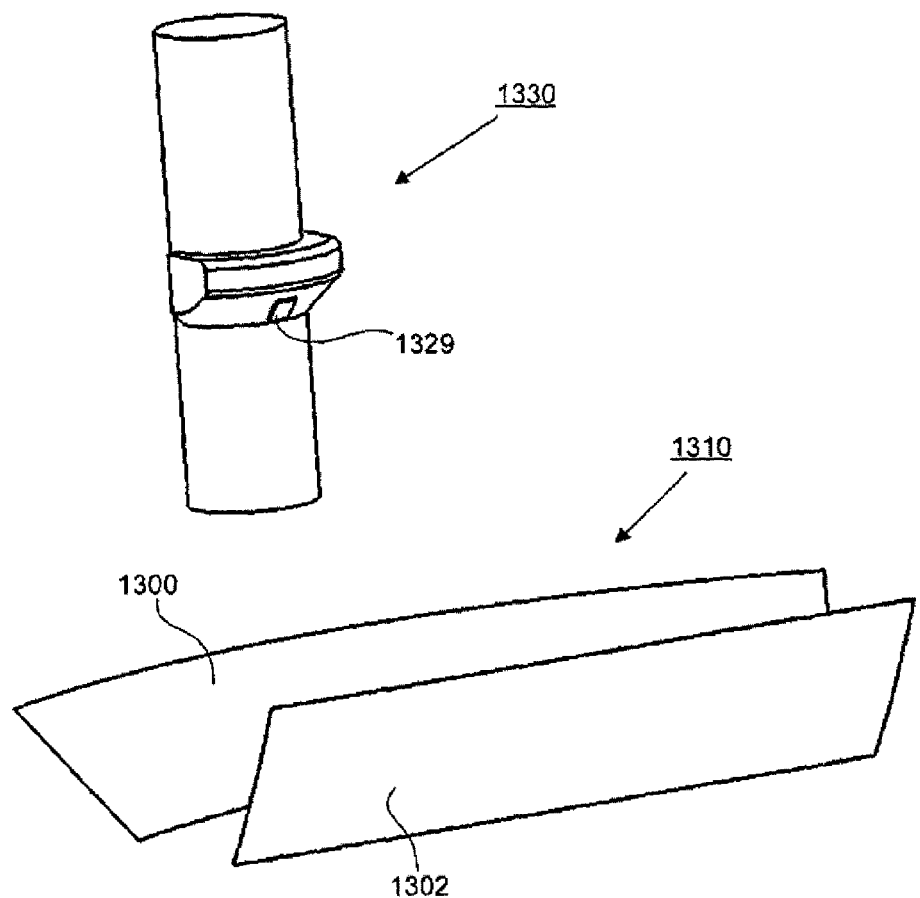
FIG. 13a is a schematic perspective view illustrating use of a focussing system of the type shown in FIG. 2 configured to focus light onto a heating element of a Stirling engine.
Figure 13B:
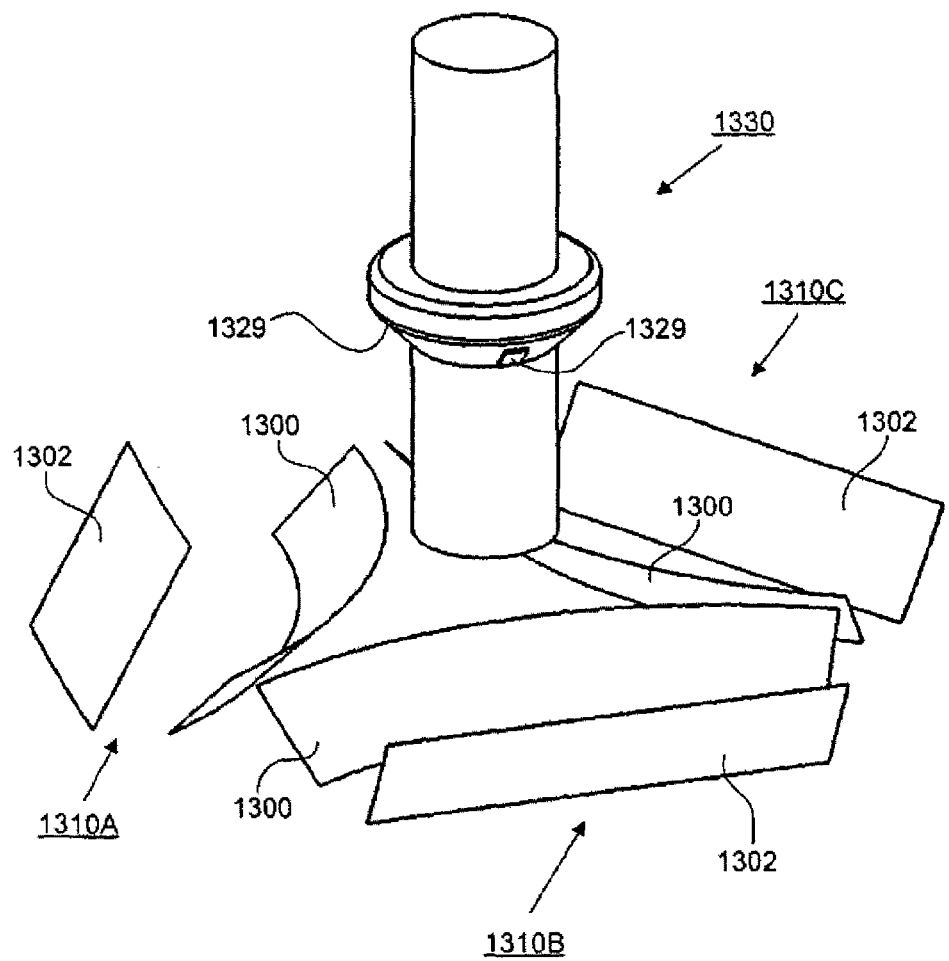
FIG. 13b is a schematic side view illustrating use of three focussing systems of the type shown in FIG. 2 each configured to focus light onto a different heating element of a Stirling engine.

FIGS. 13a and 13b show embodiments where one or more focussing systems 1310, each consisting of first and second reflective elements 1300 and 1302 respectively, is/are used as part of a Stirling cycle generator. In FIG. 13a, a single focussing system 1310, of the type shown in FIG. 2, is used to provide the input to the heater of a single Stirling engine 1330 via window 1329. In FIG. 13b, the Stirling engine 1330 has three separate heater assemblies and each has its own focussing system 1310A, 1310B and 1310C configured to direct radiation through a corresponding window 1329.

Figure 14:
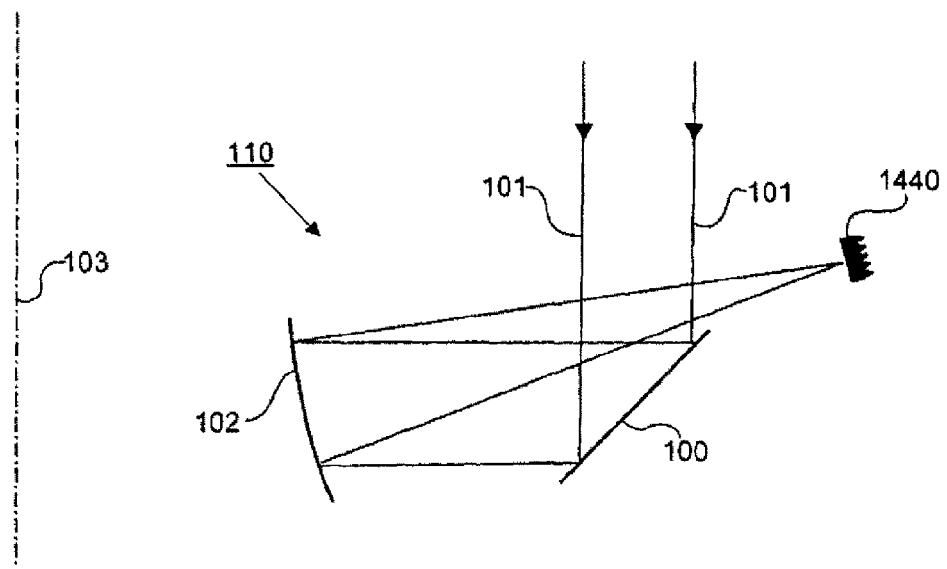
FIG. 14 is a schematic side view illustrating use of a focussing system according to the type shown in FIG. 4 with a Photo-Voltaic generator.

FIG. 14 shows how a Photo-Voltaic Generator might be integrated with the embodiment shown in FIG. 4.

The embodiments described above show how the invention is capable of focussing parallel light with high levels of concentration. It will be seen that the embodiments that produce aberration-free point foci may also be used as the basis of light weight, low cost astronomical telescopes capable of high magnification, where they would act as the primary mirror. It will also be seen that the focussing action is reversible and that various embodiments of the invention may also be used to produce substantially parallel light from a point light source.

Certain embodiments are capable of aberration free point foci and hence extremely high levels of concentration.

Figure 15A:
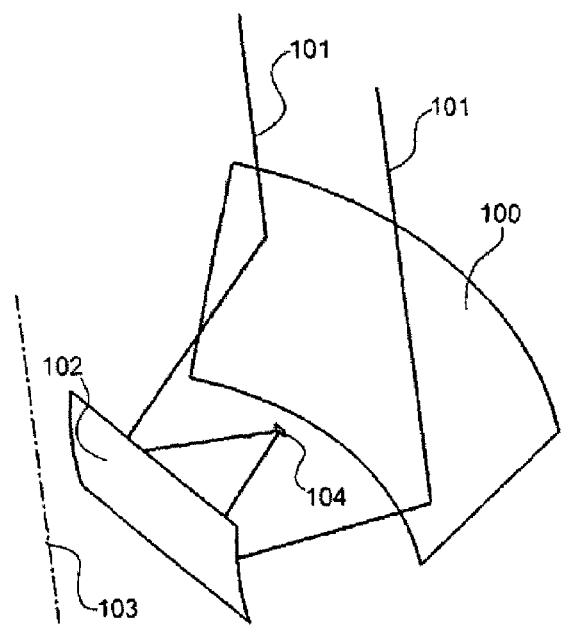
FIGS. 15a to 15c illustrate a specific example of an aberration-free focussing system.
Figure 15B:
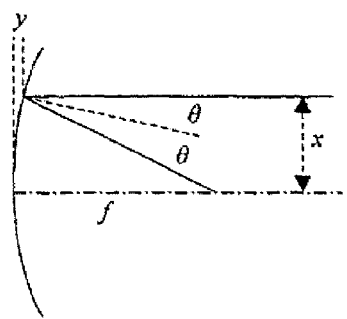
Figure 15C:
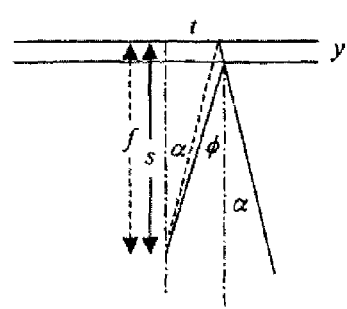

FIGS. 15a to 15c illustrate a specific example of an aberration-free focussing system.

FIG. 15a shows a first reflective element 100 formed from a 60 degree sector of the surface of a cone at 45 degrees inclination. The first reflective element 100 is such that when planar radiation 101 is incident along the first alignment axis 103 of the cone (from "above"), a focus would be formed along a portion of the first alignment axis in the absence of any obstacles. In the present arrangement, a second reflective element 102 is provided to reflect the rays reflected from the first reflective element 100 towards a second focus 104. The second reflective element 102 is formed from a parabolic mirror flat in a single direction perpendicular to the first alignment axis.

The geometry is shown in further detail in FIGS. 15b and 15c.

Incident radiation is reflected horizontally by the first reflective element 100 onto the second reflective element 102. A ray incident at a vertical height x and at an incident angle α is reflected at angle ϕ in the horizontal plane and at an angle 2θ in the vertical plane, as shown. The ray intercepts the central horizontal plane (i.e. the horizontal plane that contains the symmetry axis of the parabola defining the curvature of the second reflective element and which intersects a vertically central portion of the second reflective element 102 illustrated in FIG. 15) at a distance f and the central vertical plane (i.e. the vertical plane that contains the first alignment axis and is perpendicular to the direction that the second reflective element is flat, and which intersects a horizontally central portion of the second reflective element 102 illustrated in FIG. 15) at a distance s from the second reflective element 102.

A ray incident in the central horizontal plane at an incident angle a and striking the second reflective element 102 at a distance t from the central vertical plane is reflected at an angle α and intercepts the central vertical plane at a distance f from the second reflective element 102. This ray is incident in the same vertical plane as the ray incident at a height x and angle α.

For a parabolic mirror defined by $$y = ax^2, \quad f = 1/4a, \tag{1, 2}$$

the angle ϕ is given by $$\tan\phi = \tan\alpha/\cos 2\theta, \tag{3}$$

and the distance s by $$s = y + (t + y\tan\alpha)\cot\phi. \tag{4}$$

The distance t is given by $$t = f\tan\alpha = \tan\alpha/4a. \tag{5}$$

The angle θ is related to a and x by $$\frac{dy}{dx} = 2ax = \tan\theta. \tag{6}$$

The distance s is equal to using (1) and (3)

$$s = y + (1/4a + y)\tan\alpha\cot\phi \tag{7}$$
$$= ax^2 + (1/4a + ax^2)\cos 2\theta$$
$$= ax^2 + [(1 + 4a^2x^2)\cos 2\theta]/4a.$$

Using the identity and (6), yields $$\cos 2\theta = (1 - \tan^2\theta)/(1 + \tan^2\theta), \tag{8}$$
$$= (1 - 4a^2x^2)/(1 + 4a^2x^2).$$

substituting (8) into (7)

$$s = ax^2 + (1 + 4a^2x^2)(\cos 2\theta)/4a$$
$$s = ax^2 + (1 - 4a^2x^2)/4a$$
$$= 1/4a$$
$$= f.$$

The combination of a first reflective element 100 consisting of a sector of the surface of a cone at 45 degrees inclination with a second reflective element 102 consisting of a reflex parabolic mirror therefore gives an aberration-free focus. The surface of the cone has to be at 45 degrees to the first alignment axis for the above analysis to hold, so that light reflected from the surface of the cone is perpendicular to the first alignment axis.

For a 60 degree sector of the surface of a cone of mean radius (R) 2000 mm and horizontal width (W) 600 mm, the collecting area is πRW/3≈1250,000 mm². The vertical width of the surface of the cone is equal to its horizontal width i.e. 600 mm, so for a maximum value of 2θ=30 degrees, f≈600 mm. Taking the angular diameter of the Sun as δ(0.0093 radians), the size of the image S≈(fδ×Rδ)/cos²30≈140 mm², giving a concentration of ~9000. This can be compared with the theoretical maximum for an acceptance of ±α degrees of sin²(α)/sin²(δ/2)≈11500.

In general, for a reflective element comprising a sector of the surface of a cone inclined at 45 degrees whose mid-point is at a distance x from the first alignment axis (the axis of the cone), the second focus 104 can be positioned by the second reflective element 102 within a square plane of side 2x, bounded on one side by the first axis and passing through the mid-point of the surface of the cone of the first reflective element 100.

Figure 16:
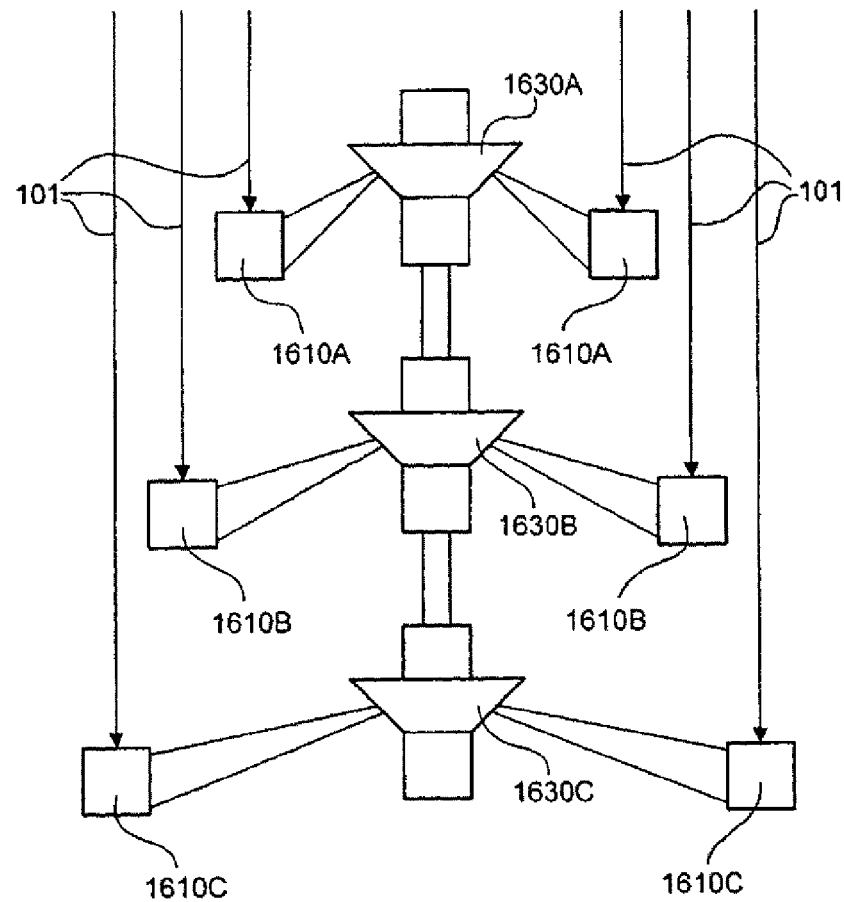
FIG. 16 is a schematic side view of a multiple target focussing system deployed to focus radiation onto three different cylinders of a multi-cylinder Stirling engine longitudinally aligned with the direction of incidence of solar radiation.
Figure 17:
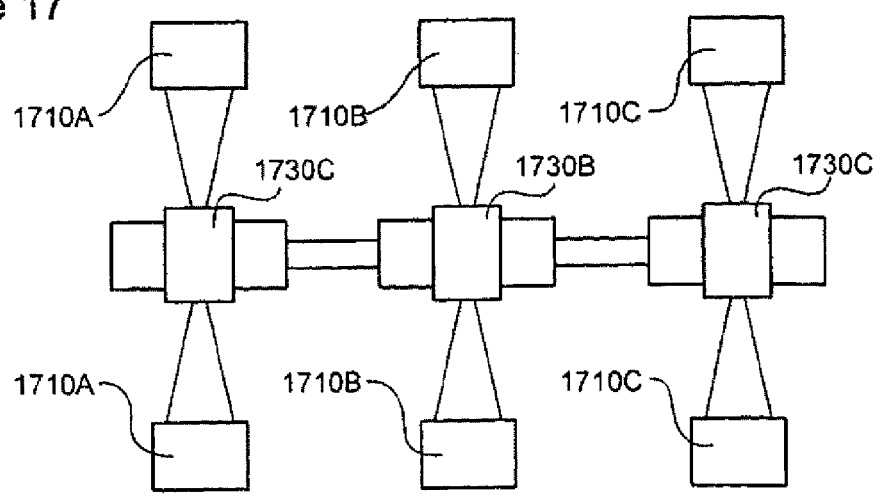
FIG. 17 is a schematic side view of a multiple target focussing system deployed to focus radiation onto three different cylinders of a multi-cylinder Stirling engine longitudinally aligned perpendicular to the direction of incidence of solar radiation.

FIGS. 16 and 17 illustrate multiple target focussing systems for concentrating radiation onto a plurality of targets simultaneously. In both examples, three different targets are shown, but other multiples such as two or a number higher than three could be achieved.

FIG. 16 is a schematic side view of a multiple target focussing system having three separate focussing systems 1610A-C each configured to focus incident radiation 101 onto a respective one of the cylinders 1630A-C of a multi-cylinder Stirling engine. In the example shown, each of the three focussing systems 1610A-C are longitudinally aligned with the same second alignment axis (i.e. the notional cones with respect to which the first reflective elements of the focussing systems 1610A-C form a polar array), and the three cylinders of the Stirling engine are also aligned with the same second alignment axis.

FIG. 17 is a schematic top view (i.e. looking down the direction of incident radiation, which is therefore not shown) of a multiple target focussing system having three separate focussing systems 1710A-C which are configured to focus radiation onto a respective one of cylinders 1730A-C of a multi-cylinder Stirling engine. In contrast to the example shown in FIG. 16, the cylinders of the Stirling engine of FIG. 17 are aligned relative to a horizontal axis (or an axis perpendicular to the direction of incident radiation). The three focussing systems 1710A-C have alignment axes that are parallel to each other and separated in a direction perpendicular to the direction of incident radiation, and are each configured to concentrate radiation onto a different one of the three cylinders 1730A-C. The second foci of each of the three focussing systems 1710A-C are thus separated from each other in a direction perpendicular to the direction of incident radiation.

The invention claimed is:

1. A focussing system for concentrating solar radiation onto a target surface, comprising:
a first reflective element forming part of a conical surface axially aligned along a first alignment axis, the first reflective element being positioned such that when planar radiation is incident on the first reflective element in a direction parallel to the first alignment axis, the planar radiation is focussed towards a first focus lying along the first alignment axis, wherein said part of the conical surface is contained within a sector having an included angle of less than 180 degrees; and
a second reflective element having a reflective surface that at all points is flat in a direction parallel to a single reference direction, the second reflective element being positioned between the first reflective element and the first focus such that, when planar radiation is incident on the first reflective element in a direction parallel to the first alignment axis, radiation reflected from the first reflective element onto the second reflective element is focussed towards a second focus.

2. A focussing system according to claim 1, wherein the first focus is a line focus and the second focus is a point focus.

3. A focussing system according to claim 1, wherein the second reflective element is at all points curved in all directions not parallel to the single reference direction.

4. A focussing system according to claim 3, wherein the curvature of the second reflective element is parabolic perpendicular to the single reference direction.

5. A focussing system according to claim 1, wherein the first reflective element is formed from a sector of the surface of a cone at 45 degrees inclination to the first alignment axis.

6. A focussing system according to claim 1, wherein the first and second reflective elements are arranged so that when planar radiation is incident on the focussing system parallel to the first alignment axis the second focus is positioned so as to be closer to the source of the planar radiation than the second reflective element.

7. A focussing system according to claim 1, wherein the first and second reflective elements are arranged so that when planar radiation is incident on the focussing system parallel to the first alignment axis the second focus is positioned so as to be further from the source of the planar radiation than the second reflective element.

8. A focussing system according to claim 1, wherein:
the first reflective element comprises a plurality of separate reflective elements, each forming part of the surface of a cone axially aligned along the first alignment axis, the plurality of reflective elements being such that when planar radiation is incident on the plurality of reflective elements parallel to the first alignment axis, the planar radiation is focussed towards a combined vertical focus, representing the region where intersecting radiation flux from all of the reflective elements is most concentrated in a plane parallel to the first alignment axis and normal to the first reflective elements, and a combined horizontal focus formed from the overlapping line foci from each of the plurality of reflective elements making up the first reflective element.

9. A focussing system according to claim 1, wherein:
the second reflective element comprises a plurality of separate reflective elements, each having a reflective surface that is flat in a direction parallel to a single reference direction, the plurality of reflective elements being such that when planar radiation is incident on the first reflective element parallel to the first alignment axis, radiation reflected from the first reflective element onto the plurality of reflective elements making up the second reflective element is focussed towards a combined vertical focus, representing the region where intersecting radiation flux from all of the plurality of reflective elements making up the second reflective element is most concentrated in a plane parallel to the first alignment axis and normal to the first reflective element, and a combined horizontal focus formed from line foci from each of the plurality of reflective elements making up the second reflective element.

10. A focussing system according to claim 8, wherein:
the or each second reflective element is a planar mirror; and
the focussing system further comprises a secondary concentrator configured to concentrate light received from the second reflective element, the secondary concentrator being configured so that the combined vertical focus is positioned at an entry to the secondary concentrator and the combined horizontal focus is positioned at an exit of the secondary concentrator.

11. A focussing system according to claim 1, wherein one or more of the reflective elements are formed from flat sheet that has been bent or rolled into the required shape.

12. A focussing system according to claim 1, wherein the first or second reflective element consists of a nominally flat sheet and the system further comprises:
curved guides or a clamping system for holding the nominally flat sheet at a peripheral portion in such a way as to cause the nominally flat sheet to bend into the required shape.

13. A focussing system according to claim 1, further comprising:
a third reflective element positioned so as to intercept radiation reflected from the second reflective element and thereby reposition the second focus.

14. A multiple target focussing system, comprising:
a first focussing system according to claim 1; and
a second focussing system according to any one of the preceding claims, wherein:
the first and second focussing systems are aligned along a second alignment axis that is parallel to the first alignment axes of the first and second focussing systems, and the second foci of the first and second focussing systems are spaced apart along the second alignment axis; or
the first focussing system is aligned along a first alignment axis and the second focussing system is aligned along a second alignment axis, the first alignment axis being parallel to and spaced apart from the second alignment axis, the second foci of the first and second focussing systems being spaced apart in a direction perpendicular to the first and second alignment axes.

15. A solar powered system, comprising:
a heat driven engine;
a heat exchanger surface for receiving solar energy to drive the heat driven engine; and
a focussing system according to claim 1, configured to concentrate solar radiation onto the heat exchanger surface.

16. A solar powered system according to claim 15, further comprising:
a housing surrounding the heat exchanger surface and configured so as to inhibit upward movement of gas in use from the region of the heat exchanger surface, the housing comprising an aperture to allow solar radiation from the focussing system to reach the heat exchanger surface.

17. A solar powered system, comprising:
a heat driven engine;
a first heat exchanger surface for receiving solar energy to drive a first part of the heat driven engine;
a second heat exchanger surface for receiving solar energy to drive a second part of the heat driven engine, different from the first part; and
a multiple target focussing system according to claim 14, wherein:
   the second focus of the first focussing system is directed onto the first heat exchanger surface; and
   the second focus of the second focussing system is directed onto the second heat exchanger surface.
18. A solar powered system, comprising:
a photo-voltaic generator; and
a focussing system according to claim 1, configured to concentrate solar radiation onto the photo-voltaic generator.
19. A kit for assembling a focussing system according to claim 1, comprising:
   one or more portions of flat sheet for forming one or more of the following by bending or rolling: the first reflective element, the second reflective element, and any reflective element making up the first or second reflective element.
20. A focussing system according to claim 9, wherein:
the or each second reflective element is a planar mirror; and
the focussing system further comprises a secondary concentrator configured to concentrate light received from the second reflective element, the secondary concentrator being configured so that the combined vertical focus is positioned at an entry to the secondary concentrator and the combined horizontal focus is positioned at an exit of the secondary concentrator.

* * * * *